(12) United States Patent
Jang et al.

(10) Patent No.: US 12,223,346 B2
(45) Date of Patent: Feb. 11, 2025

(54) SELECTIVELY OFFLOADING THE COMPRESSION AND DECOMPRESSION OF FILES TO A HARDWARE CONTROLLER

(71) Applicant: Dell Products L.P., Round Rock, TX (US)

(72) Inventors: Young Hwan Jang, Gyeonggi-do (KR); Gokul Thiruchengode Vajravel, Bangalore (IN)

(73) Assignee: Dell Products L.P., Round Rock, TX (US)

( * ) Notice: Subject to any disclaimer, the term of this patent is extended or adjusted under 35 U.S.C. 154(b) by 654 days.

(21) Appl. No.: 17/313,893

(22) Filed: May 6, 2021

(65) Prior Publication Data

US 2022/0357980 A1 Nov. 10, 2022

(51) Int. Cl.
| | |
|---|---|
| G06F 9/48 | (2006.01) |
| G06F 3/06 | (2006.01) |
| G06F 9/50 | (2006.01) |
| H03M 7/30 | (2006.01) |

(52) U.S. Cl.
CPC .......... *G06F 9/4856* (2013.01); *G06F 3/0608* (2013.01); *G06F 3/0659* (2013.01); *G06F 3/0673* (2013.01); *G06F 9/505* (2013.01); *H03M 7/607* (2013.01)

(58) Field of Classification Search
CPC .... G06F 3/0608; G06F 3/0659; G06F 3/0673; G06F 9/505; H03M 7/607
See application file for complete search history.

(56) References Cited

U.S. PATENT DOCUMENTS

| | | | | |
|---|---|---|---|---|
| 9,825,648 B1* | 11/2017 | Gopal | ..................... | G06F 3/061 |
| 11,231,987 B1* | 1/2022 | Bose | ..................... | G06F 11/327 |
| 2005/0015528 A1* | 1/2005 | Du | .......................... | G10L 19/00 |
| | | | | 710/68 |
| 2012/0210066 A1* | 8/2012 | Joshi | .................... | G06F 12/0888 |
| | | | | 711/E12.017 |
| 2012/0213328 A1* | 8/2012 | Dolazza | ................... | A61B 6/56 |
| | | | | 378/19 |
| 2014/0372715 A1* | 12/2014 | Bak | ........................ | G06F 12/126 |
| | | | | 711/158 |
| 2015/0378613 A1* | 12/2015 | Koseki | .................. | G06F 3/0635 |
| | | | | 711/103 |
| 2017/0116004 A1* | 4/2017 | Devegowda | ........ | G06F 9/44505 |
| 2017/0134041 A1* | 5/2017 | Haverkamp | ........ | G06F 16/1744 |

(Continued)

FOREIGN PATENT DOCUMENTS

CN 108599774 A * 9/2018 .............. H03M 7/30

*Primary Examiner* — Lewis A Bullock, Jr.
*Assistant Examiner* — Kevin X Lu
(74) *Attorney, Agent, or Firm* — Kirton McConkie; Brian Tucker

(57) ABSTRACT

The compression and decompression of files can be selectively offloaded to a hardware controller. A hardware controller, such as the controller of an SSD or other drive, can include a compression engine that is configured to implement compression techniques. A filter driver in the I/O pathway on a computing device may be configured to intercept an application's attempt to write a file to or read a file from the SSD or other drive and to selectively offload compression or decompression of the file to a compression engine on the SSD or other drive.

20 Claims, 11 Drawing Sheets

(56) References Cited

U.S. PATENT DOCUMENTS

| | | | |
|---|---|---|---|
| 2017/0235497 A1* | 8/2017 | Shih | H03M 7/30 |
| | | | 711/154 |
| 2017/0235752 A1* | 8/2017 | Shih | H03M 7/6076 |
| | | | 707/693 |
| 2017/0336981 A1* | 11/2017 | Garcia | G06F 3/0673 |
| 2017/0371595 A1* | 12/2017 | De | G06F 9/44521 |
| 2018/0027062 A1* | 1/2018 | Bernat | G06F 9/4401 |
| | | | 709/224 |
| 2018/0069568 A1* | 3/2018 | Zhang | H03M 7/3084 |
| 2018/0196755 A1* | 7/2018 | Kusuno | G06F 12/0893 |
| 2019/0079799 A1* | 3/2019 | Kumar | G06F 9/4843 |
| 2021/0036714 A1* | 2/2021 | Martin | H03M 7/6064 |
| 2021/0141723 A1* | 5/2021 | Lee | G06F 12/0276 |
| 2021/0281643 A1* | 9/2021 | Szczepanik | H04L 47/115 |
| 2022/0086269 A1* | 3/2022 | Gao | H04M 1/663 |
| 2022/0197551 A1* | 6/2022 | Li | G06F 3/0679 |
| 2022/0245071 A1* | 8/2022 | Vajravel | G06F 13/385 |

* cited by examiner

SELECTIVELY OFFLOADING THE COMPRESSION AND DECOMPRESSION OF FILES TO A HARDWARE CONTROLLER

CROSS-REFERENCE TO RELATED APPLICATIONS

N/A

BACKGROUND

Gaming files are becoming larger each year to provide a more immersive experience. For example, the size of the installation files for many games now exceeds 100 GB. Due to the large sizes of gaming files, gamers frequently run out of storage, particularly when they use solid state drives.

The increasing size of the gaming files is primarily due to audio, video and texture files. Games are increasingly using 5.1 surround sound audio as opposed to the smaller-sized mono or stereo audio. Games are also including more audio content such as voiced characters. The proliferation of high resolution video has also drastically increased the size of gaming files. For example, current games may include 4K or even 8K resolution. Due to such resolutions and their increased complexity, textures may be primarily responsible for the large increases in file size.

Although compression can be used to reduce the size of some gaming files, it may not be a suitable option in many cases. For example, decompressing some content of a gaming file, such as audio and texture content, can be an extremely CPU and memory-intensive process. Therefore, when a gaming file is stored in a compressed format, the game may be configured to present a loading screen while the gaming file is decompressed. It is not uncommon for such loading screens to be displayed for multiple minutes while the game is sufficiently decompressed and loaded to be able to proceed to an interactive screen. With some games, the time that would be required to decompress the gaming file is so great that the game developer may forego the use of compression for some or all of the gaming file thus causing the gaming file to require a larger amount of storage. Accordingly, there is a tradeoff between compressing a gaming file to save storage space and foregoing the use of compression to enhance performance.

Another issue caused by the increased size of gaming files is the endurance of the storage drive. For example, with the larger file sizes, more data will be written to the storage drive thereby causing the storage drive to more quickly reach its TBW (terabytes written) and/or DWPD (device writes per day) thresholds. As game developers forego compression to minimize loading times, the endurance of storage drives will be further challenged.

BRIEF SUMMARY

The present invention extends to systems, methods and computer program products for selectively offloading the compression and decompression of files to a hardware controller. A hardware controller, such as the controller of an SSD or other drive, can include a compression engine that is configured to implement compression techniques. A filter driver in the I/O pathway on a computing device may be configured to intercept an application's attempt to write a file to or read a file from the SSD or other drive and to selectively offload compression or decompression of the file to a compression engine on the SSD or other drive.

In some embodiments, the present invention may be implemented as a method for selectively offloading compression or decompression of a file to a hardware controller. A request to write a first file to a drive can be received on a computing device. An application that is a source of the request can then be identified. A selective compression configuration can be accessed to determine whether compression of files written by the application should be offloaded to a compression engine on the drive. In response to determining that the compression of files written by the application should be offloaded to the compression engine on the drive, a request can be sent to the compression engine to request that the compression engine compress the first file on the drive and then store the first file on the drive.

In some embodiments, the present invention may be implemented as a method for selectively offloading compression or decompression of a file to a hardware controller. A request to read a first file can be received on a computing device. An application that is a source of the request can be identified. A selective compression configuration can be accessed to determine whether decompression of files read by the application should be offloaded to a compression engine on the drive. In response to determining that the decompression of files read by the application should be offloaded to the compression engine on the drive, a request can be sent to the compression engine to request that the compression engine decompress the first file on the drive and then store the decompressed first file in memory on the computing device.

In some embodiments, the present invention may be implemented as a computing system that includes a computing device having a CPU, memory and a filter driver that is loaded in an I/O pathway. The computing system may also include a drive having a compression engine. The drive is accessible to applications executing on the computing device. The filter driver and the compression engine may be configured to implement a method for selectively offloading compression and decompression of files that the applications attempt to read and write to the drive. The filter driver may maintain a selective compression configuration. In response to receiving requests to write files to the drive, the filter driver may determine, for each request, whether the selective compression configuration specifies that the respective file should be compressed by the compression engine on the drive rather than by the CPU, and, if so, may cause the compression engine to compress the respective file.

This summary is provided to introduce a selection of concepts in a simplified form that are further described below in the Detailed Description. This Summary is not intended to identify key features or essential features of the claimed subject matter.

BRIEF DESCRIPTION OF THE DRAWINGS

Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
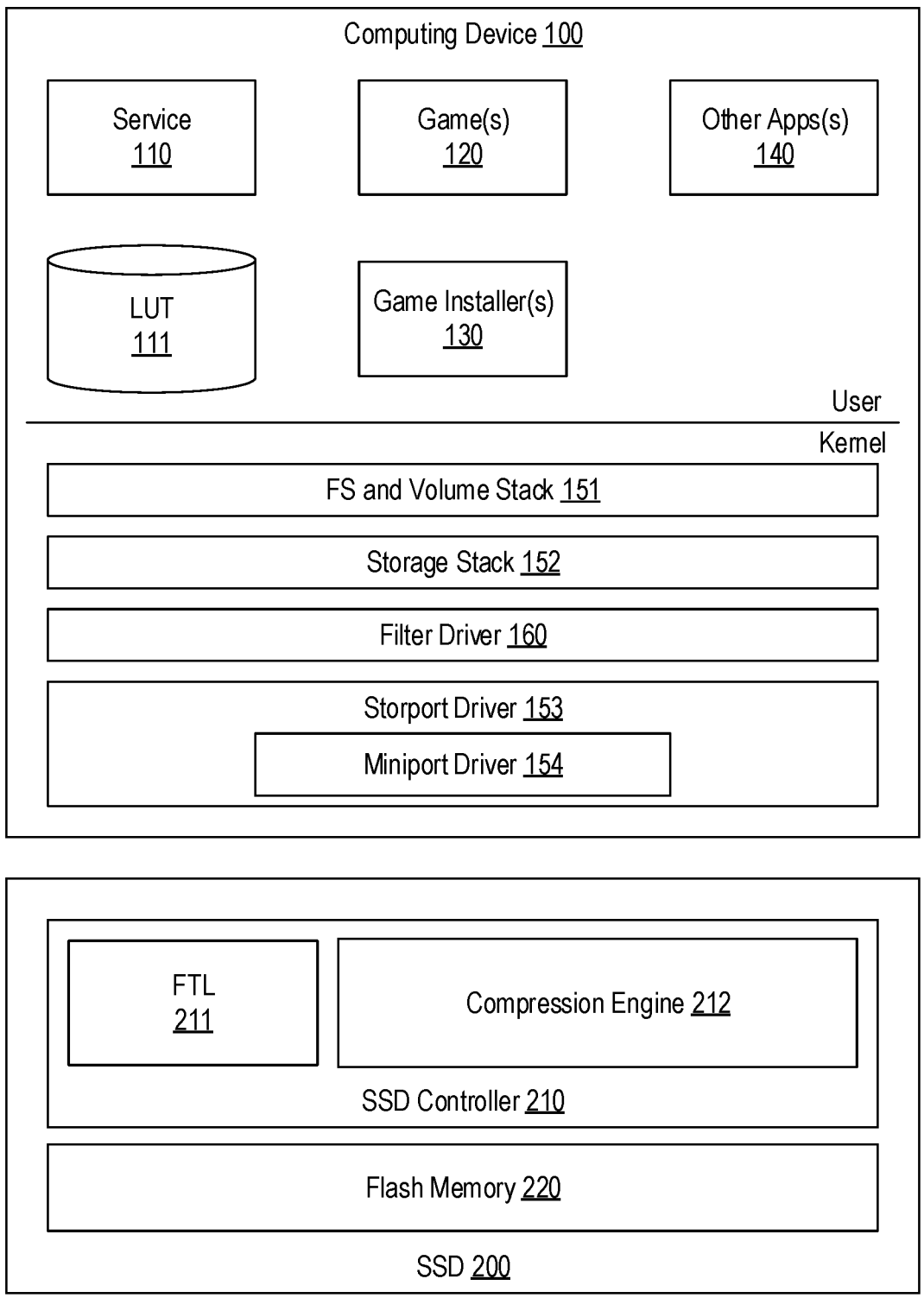
FIG. 1 illustrates an example computing architecture which may be used to implement embodiments of the present invention.

FIG. 1 provides an example of a computing architecture in which one or more embodiments of the present invention may be implemented. This computing architecture includes a computing device 100 and a solid-state drive (SSD) 200. SSD 200 may be connected to, integrated into or otherwise accessible to computing device 200. Although an SSD is used to describe the example embodiments herein, embodiments of the present invention may also be implemented when computing device 100 employs another type of drive.

Computing device 100 may include a number of components, some of which are depicted in FIG. 1. For example, computing device 100 may include an operating system that provides an I/O pathway for accessing SSD 200. This I/O pathway may include a file system and volume stack 151, a storage stack 152, a storport driver 153 and a miniport driver 154. Although this example is Windows-based, it is to be understood that embodiments of the present invention could equally be implemented in other operating system environments.

In accordance with some embodiments of the present invention, the I/O pathway may also include a filter driver 160. In the depicted embodiment, filter driver 160 is layered above storport driver 153 to enable it to perform the functionality described below. However, filter driver 160 could be configured/positioned in any other manner that enables it to perform such functionality (e.g., above the SCSI LLD driver in a Unix-based environment).

SSD 200 may include an SSD controller 210, which may implement a flash translation layer 211, and flash memory 220 which can be used to store data such as files. Miniport driver 154 and SSD controller 210 may be configured to communicate via NVMe or any other suitable transport. In accordance with some embodiments of the present invention, SSD controller 210 may also include a compression engine 212.

In accordance with some embodiments of the present invention, computing device 100 may further include a service 110 and a lookup table 111. Computing device 100 may additionally include one or more games 120, one or more game installers 130 and one or more other applications 140. As described in detail below, service 110 and filter driver 160 may interoperate to selectively offload to compression engine 212 the compression and decompression of files (including portions of files) pertaining to games 120, game installer 130 or other applications 140.

Because compression engine 212 is part of SSD controller 210, or at least because it is located on SSD 200, it can perform its functionality separate from the CPU, GPU, memory or other hardware components on computing device 100. In particular, compression engine 212 can be leveraged to perform compression and decompression on selected files, such as those pertaining to games 120, game installer 130 and other applications 140, to prevent such compression or decompression from consuming computing device 100's hardware resources.

Figures 2, 3:
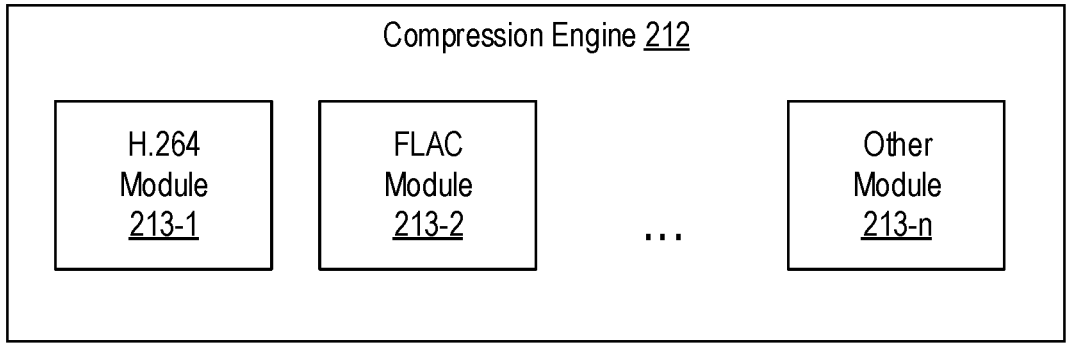
FIG. 2 illustrates an example lookup table that may be used in one or more embodiments of the present invention.
FIG. 3 illustrates an example compression engine that may be used in one or more embodiments of the present invention.

FIG. 2 provides an example of how compression engine 212 may be configured. As shown, compression engine 212 may include a number of compression modules 213-1 through 213-$n$ (collectively compression modules 213) where each compression module may be specific to a particular compression algorithm or technique. For example, compression engine 212 may include H.264 module 213-1 that is configured to implement compression and decompression in accordance with the H.264 standard, a FLAC module 213-2 that is configured to implement compression and decompression in accordance with the Free Lossless Audio Codec format and modules for a variety of other compression techniques that may be used to compress files that may be downloaded to computing device 100 and/or stored on SSD 200. Such files may be video, audio and/or texture files of a game or any other type of file for any type of application.

FIG. 3 provides an example of how lookup table 111 may be configured in some embodiments of the present invention. Lookup table 111 can generally define whether the compression/decompression of a particular file type of a particular application should be offloaded and, if so, which compression/decompression technique may be used. For example, in FIG. 2, lookup table 111 includes a column for identifying an application, a column for identifying one or more file types, a column for specifying whether offloading should be performed and a column for specifying one or more compression techniques. As shown, lookup table 111 could be used to specify that, for audio, video and texture files associated with the Steam application (an example of a game installer 130) or with the NBA 2K21 application (an example of a game 120), compression and/or decompression may be offloaded to compression engine 212 and the FLAC, BC7 and H.264 compression techniques may be used. Similarly, lookup table 111 could be used to specify that, for any file associated with Adobe Illustrator, compression and/or decompression may be offloaded to compression engine 212 and the LZSS compression technique may be used. In contrast, in some embodiments, lookup table 111 could be used to specify that, for audio, video and texture files associated with an antivirus application, compression and/or decompression should not be offloaded. A lookup table configured in accordance with embodiments of the present invention may include a variety of combinations of such information and possibly other information and may be more or less granular than the example in FIG. 2. The content of lookup table 111 will be referred to hereafter as a "selective compression configuration."

Lookup table 111 could be created/populated in any suitable manner. For example, a user or admin could manually add, modify or delete entries in lookup table 111, whether locally or from a remote computing device. As another example, entries could be automatically added, modified or deleted in lookup table 111 by service 110 or another component such as a remote management agent. Such automatic additions, modifications or deletions could occur in response to a policy, dynamically (e.g., based on performance settings, performance analysis, storage consumption, etc.) or in any other manner.

FIGS. 4-6D provide an example of how service 110 and filter driver 160 may interoperate to cause the compression and decompression of files to be selectively offloaded to compression engine 212 in some embodiments of the present invention. In this context, the term "file" should be construed as encompassing an entire file and a portion of a file.

Figure 4:
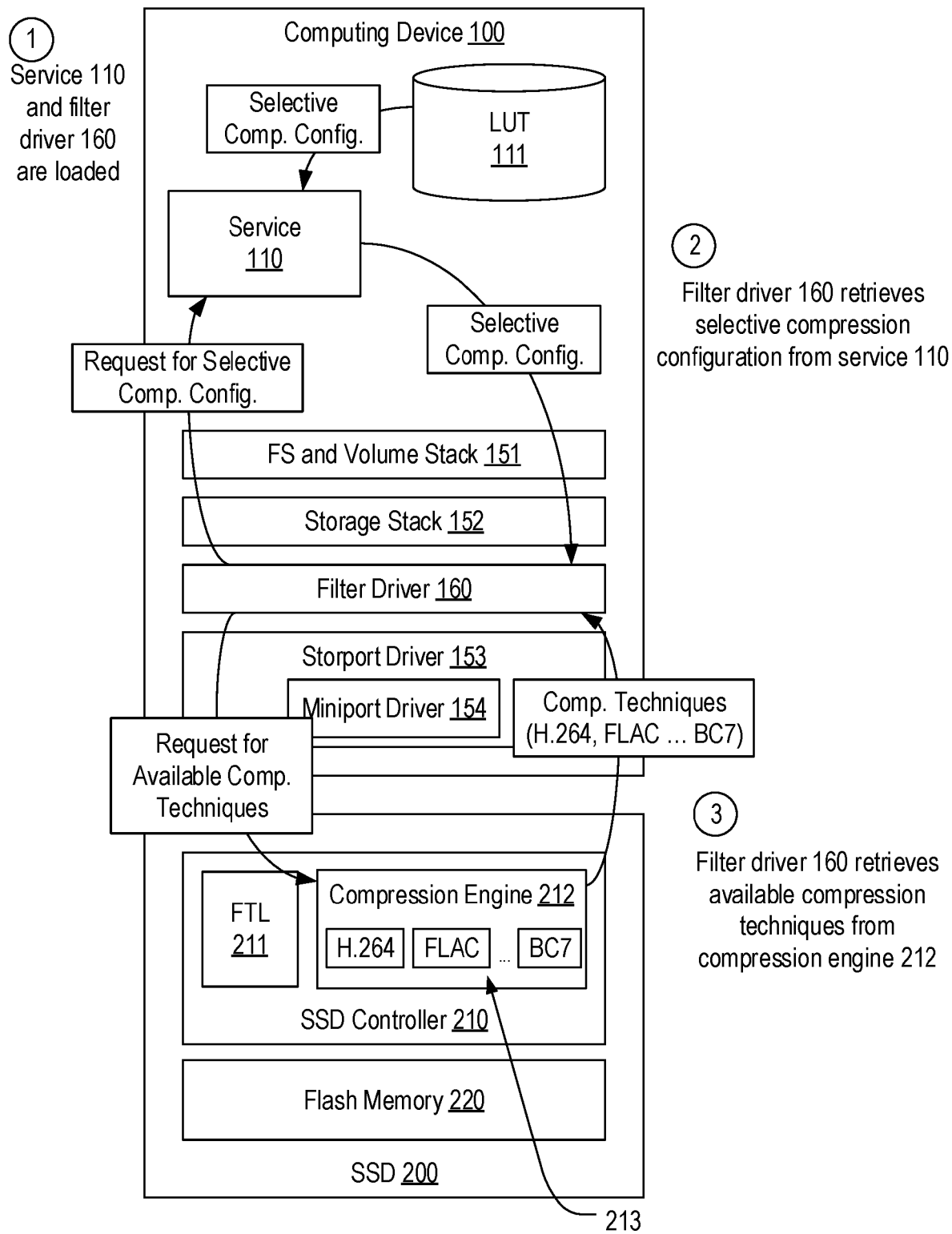
FIG. 4 represents functionality that a service and a filter driver can perform as part of initialization to enable the selective offloading of compression and decompression to be performed in accordance with one or more embodiments of the present invention.

FIG. 4 represents functionality that service 110 and filter driver 160 can perform as part of initialization. In step 1, service 110 and filter driver 160 can be loaded on computing device 100. As part of loading or at another time, service 110 or another component may be configured to populate/update lookup table 111. In any case, lookup table 111 can be populated to define a selective compression configuration to be used on computing device 100. As part of loading, filter driver 160 may register one or more callback routines such as, for example, preoperation callback routines for read and write operations in a Windows-based implementation.

In step 2, filter driver 160 can communicate with service 110 to retrieve the selective compression configuration that it should use to selectively offload the compression and decompression of files to compression engine 212. For example, as part of its initialization routine, filter driver 160 could send a request to service 110, and service 110 could respond to the request by retrieving the selective compression configuration from lookup table 111 and sending it to filter driver 160. Alternatively or additionally, filter driver 160 could send such a request to service 110 at any time such as in response to a read or write request. Filter driver 160 could then cache the selective compression configuration for subsequent use.

In step 3, filter driver 160 may also communicate with compression engine 212 to retrieve the list of available compression techniques. For example, filter driver 160 could send an I/O request to compression engine 212, and compression engine 212 could respond by enumerating each of compression modules 213 that it includes (e.g., H.264, FLAC, . . . BC7). Filter driver 160 could then cache the available compression techniques for subsequent use.

FIGS. 5A-5D provide an example of how filter driver 160 can selectively offload the decompression of a compressed file that an application, such as game 120, attempts to read from flash memory 220. In step 1a, it is assumed that a game 120 (e.g., NBA 2K21) attempts to read a compressed file stored in flash memory 220. For example, the compressed file could contain video content, audio content, textures, etc. for the game. The manner in which game 120 attempts to read the compressed file is not essential to the present invention. For example, game 120 could call the ReadFile or LZRead function in a Windows environment.

In step 1b, filter driver 160 intercepts game 120's attempt to read the compressed file. For example, the operating system could call filter driver 160's registered callback routine to allow filter driver 160 to process the I/O request (e.g., an IRP_MJ_READ request) that is generated in response to game 120's request to read the compressed file.

Figure 5A:
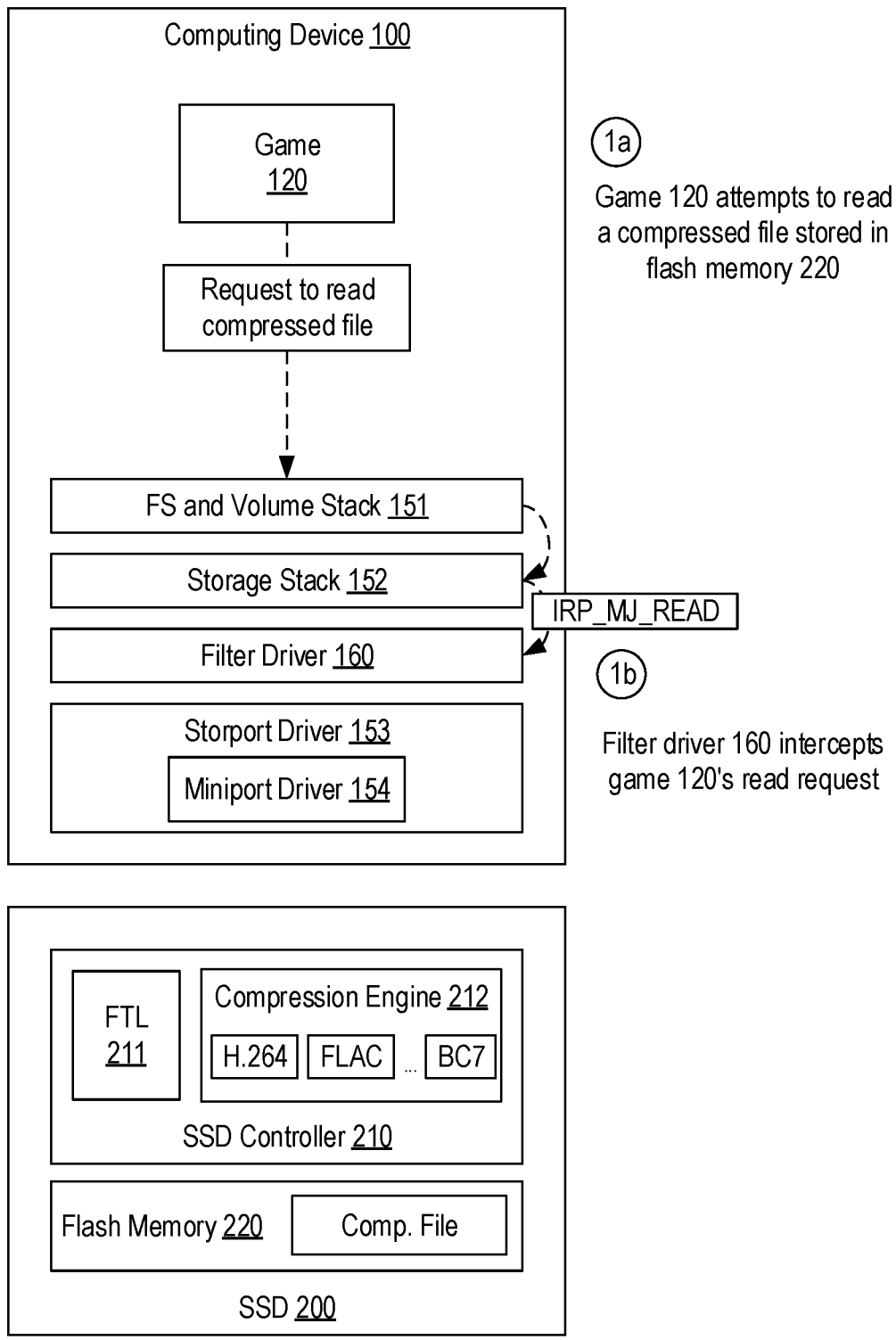
FIGS. 5A-5D provide an example of how a filter driver can selectively offload the decompression of a compressed file that an application, such as a game, attempts to read from flash memory in accordance with one or more embodiments of the present invention.
Figure 5B:
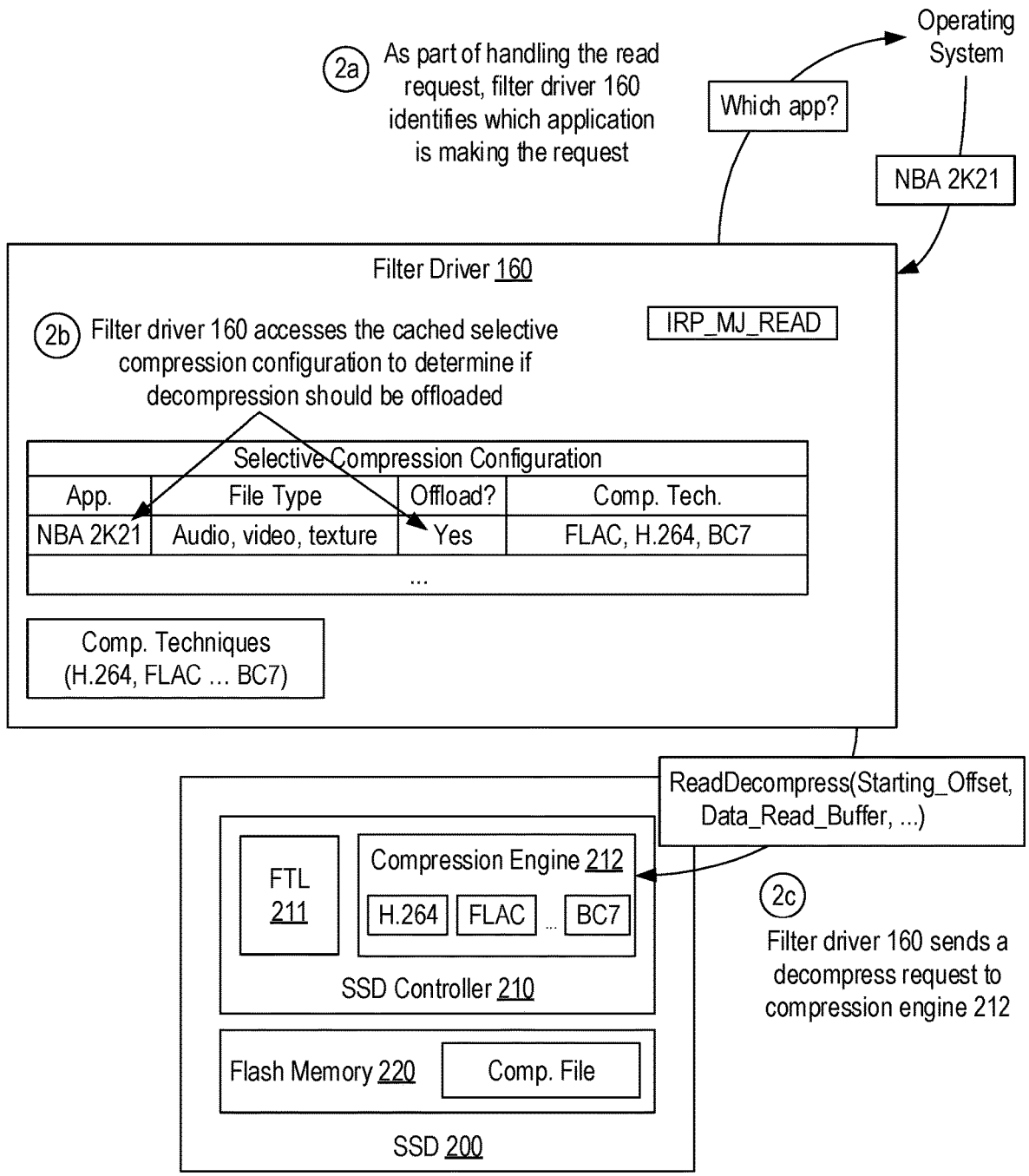

Turning to FIG. 5B, in step 2a, and as part of handling game 120's read request (e.g., as part of filter driver 160's callback routine for read requests), filter driver 160 can identify which application is the source of the read request. For example, in a Windows environment, filter driver 160 could call IoGetRequestorProcessId to obtain the process id of game 120 and then use the process id to obtain the name of game 120, which in this example is assumed to be NBA 2K21. Then, in step 2b, filter driver 160 can employ the identity of the source of the read request to determine if the cached selective compression configuration includes any applicable entries. For example, filter driver 160 could determine that the selective compression configuration includes an entry for NBA 2K21 and that the entry specifies that compression/decompression of this type of file should be offloaded to compression engine 212. Accordingly, in step 2c, as opposed to allowing the read request to be passed further down the I/O pathway in a normal fashion (which may result in the compressed file being decompressed by the CPU/GPU of computing device 100 in a typical manner), filter driver 160 can send a read decompress request to compression engine 212. In some embodiments, this read decompress request can identify the file to be read (e.g., a Starting_Offset value) and a buffer into which the data should be read (e.g., a Data_Read_Buffer value) among possibly other information.

Figure 5C:
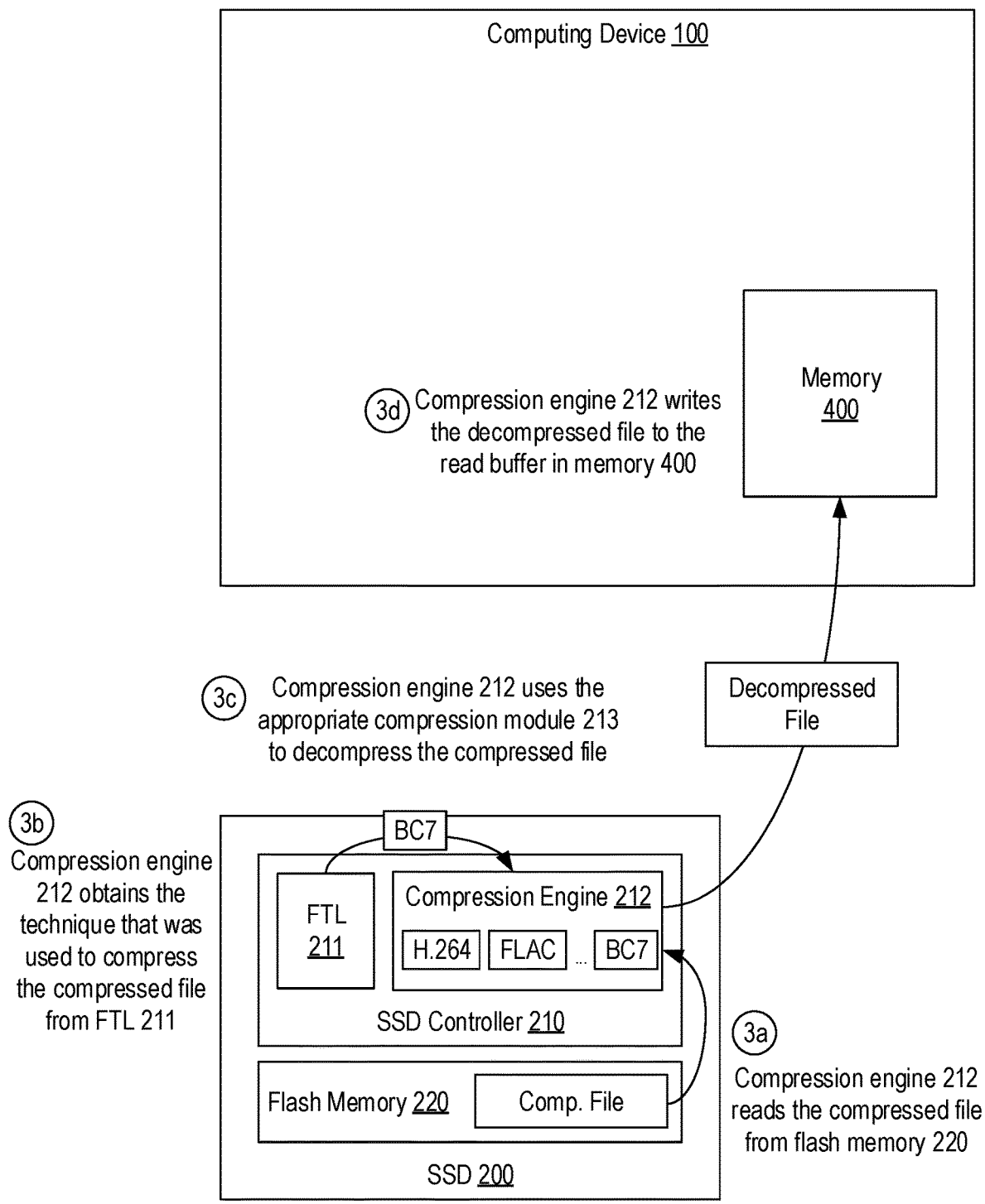

Turning to FIG. 5C, in response to receiving the read decompress request, in step 3a, compression engine 212 can read the compressed file from flash memory 220 (e.g., via FTL 211 using the Starting_Offset value to specify which logical block addresses to read). In conjunction with reading the compressed file, in step 3b, compression engine 212 may also interface with FTL 211 to identify the compression technique that was used to compress the compressed file. For example, compression engine 212 could access the metadata associated with the logical block addresses in which the compressed file is stored. In this example, it is assumed that the compressed file is a texture file stored in the BC7 format. In step 3c, compression engine 212 can use the appropriate compression module 213 to decompress the compressed file on SSD 200. For example, a BC7 module 213 could perform the decompression. In step 3d, which can be performed in conjunction with step 3c, compression engine 212 can write the decompressed file to memory 400 on computing device 100 (e.g., via DMA). For example, compression engine 212 can store the decompressed file in the read buffer (Data_Read_Buffer) that game 120 specified in its read request.

Figure 5D:
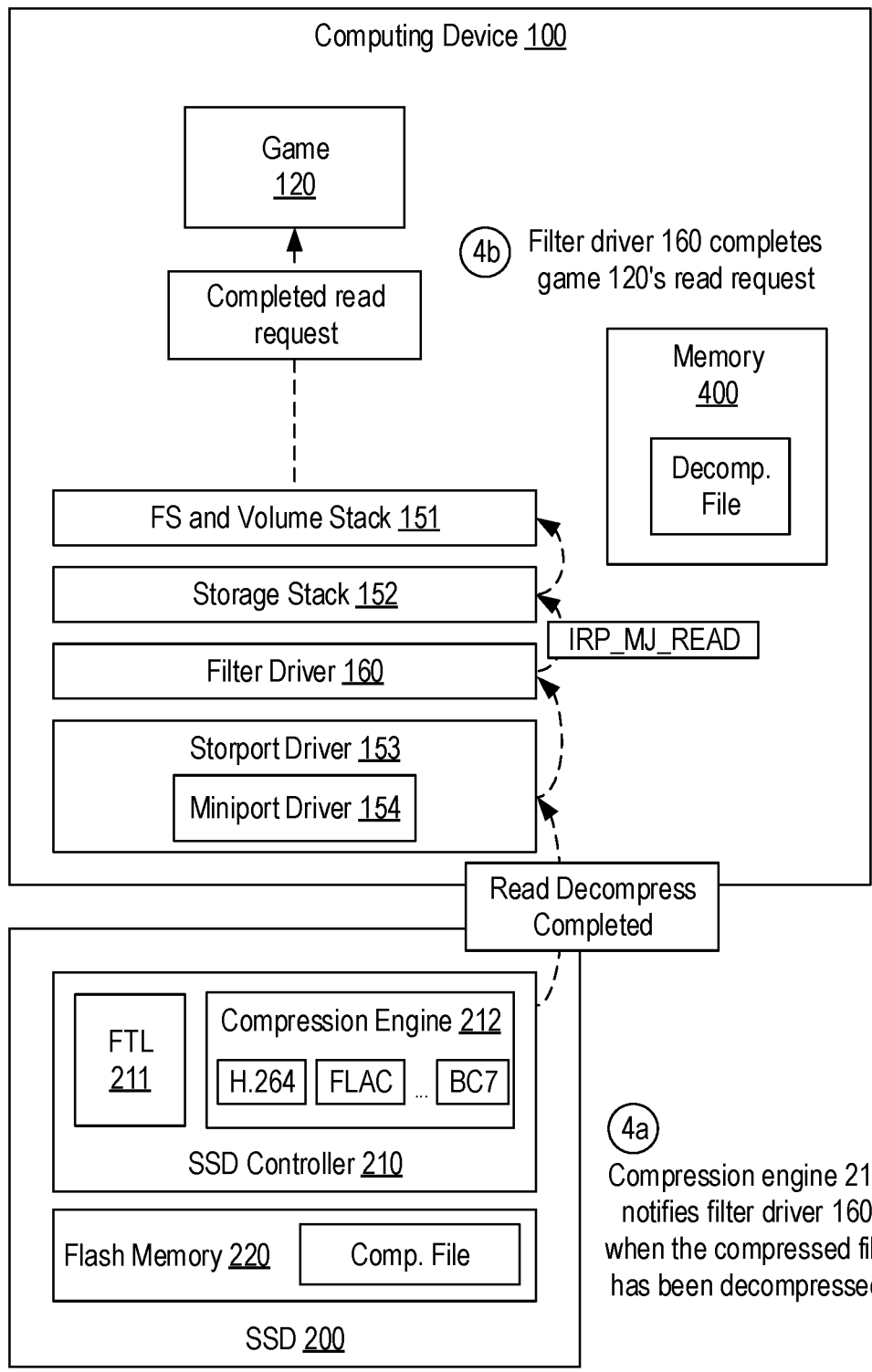

Turning to FIG. 5D, after compression engine 212 has performed the decompression on SSD 200 and then stored the decompressed file in memory 400, in step 4a, compression engine 212 can notify filter driver 160 accordingly (e.g., by causing a corresponding I/O request to be sent up the I/O pathway). Then, in step 4b, filter driver 160 can cause game 120's read request to be completed. For example, filter driver 160 can cause the I/O request pertaining to game 120's read request to be completed successfully. As a result of this process, the file that game 120 requested to read will be stored in the read buffer that game 120 specified. Notably, because the decompression is performed on SSD 200 rather than by the CPU or GPU of computing device 100, computing device 100's performance, and therefore game 120's performance, may be enhanced.

Figure 6A:
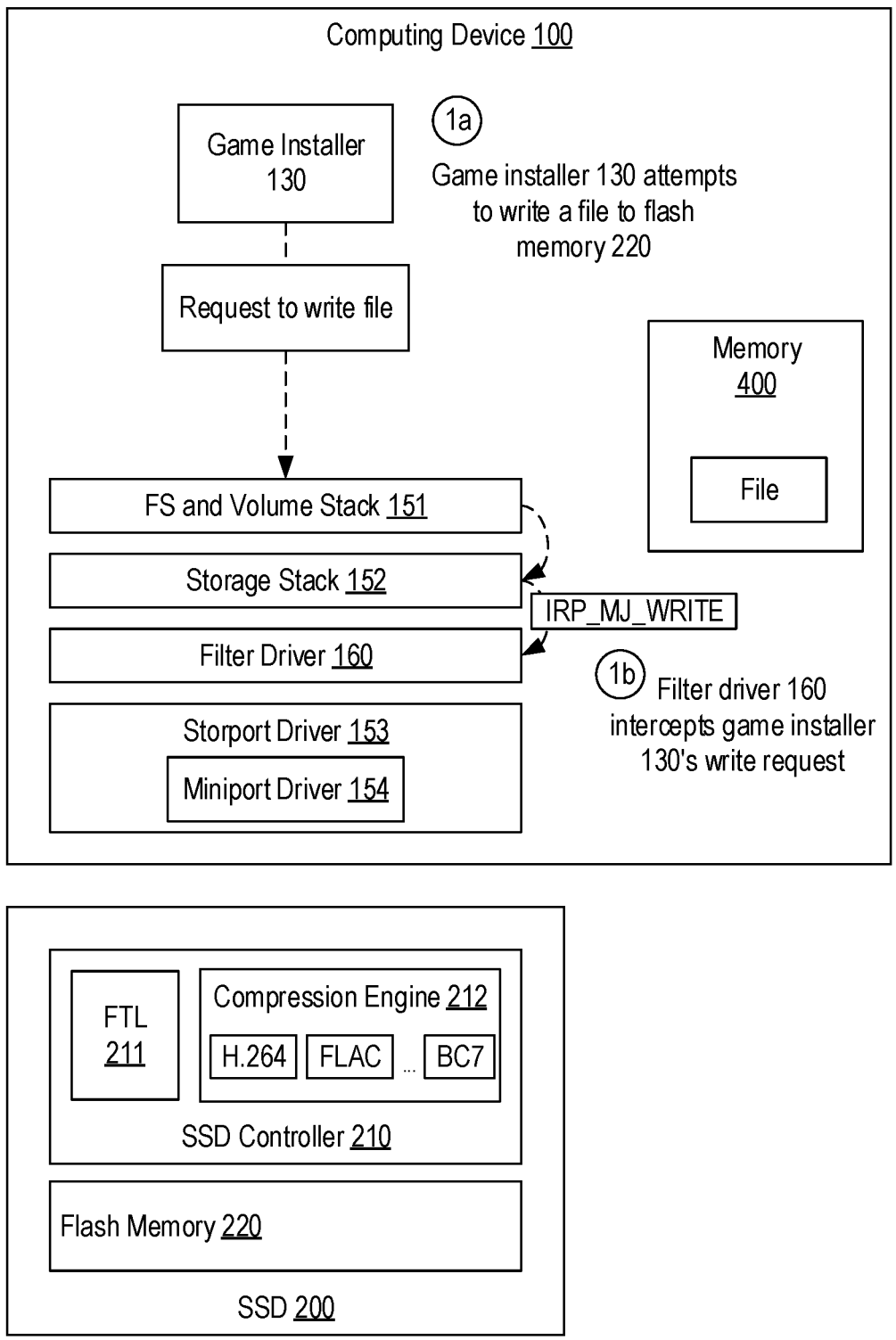
FIGS. 6A-6D provide an example of how a filter driver can selectively offload the compression of a file that an application, such as a game installer, attempts to write to flash memory in accordance with one or more embodiments of the present invention.

FIGS. 6A-6D provide an example of how filter driver 160 can selectively offload the compression of a file that an application, such as game installer 130, attempts to write to flash memory 220. Turning to FIG. 6A, in step 1a, it is assumed that game installer 130 attempts to write a file to flash memory. Notably, the file may exist in memory 400 at the time when game installer 130 makes the write request. In an example related to FIGS. 5A-5D, game installer 130 could write files as part of installing the NBA 2K21 game on computing device 100 (i.e., the steps in FIG. 6A-6D could be performed before the steps in FIGS. 5A-5D). However, game installer 130 or any other application could attempt to write a file in any other context, and therefore the steps in FIGS. 6A-6D should not be limited to game installation scenarios.

In step 1*b*, filter driver 160 intercepts game installer 130's attempt to write the file. For example, the operating system could call filter driver 160's registered callback routine to allow filter driver 160 to process the I/O request (e.g., an IRP_MJ_WRITE request) that is generated in response to game installer 130's request to write the file.

Figure 6B:
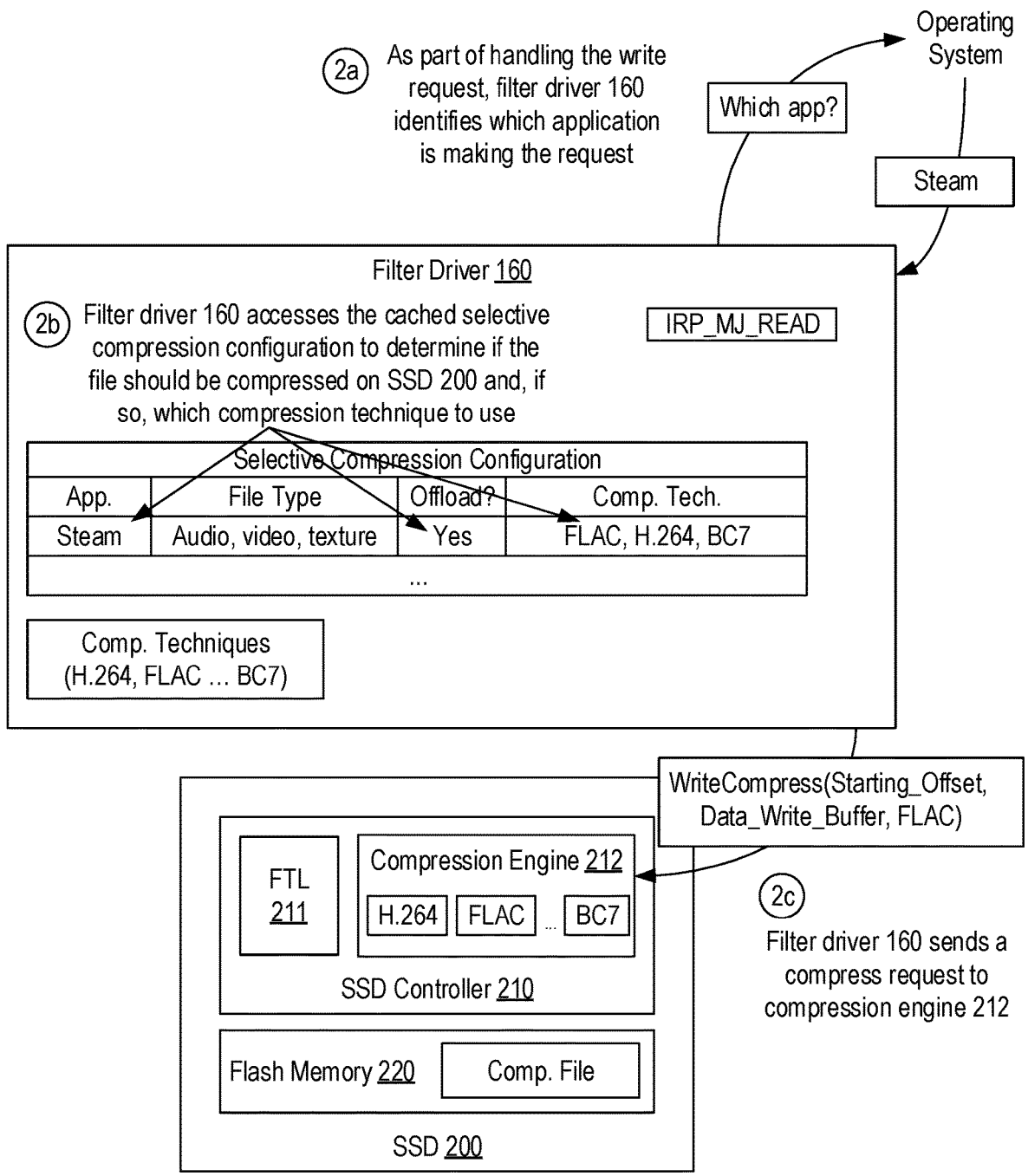

Turning to FIG. 6B, in step 2*a*, and as part of handling game installer 130's write request (e.g., as part of filter driver 160's callback routine for write requests), filter driver 160 can identify which application is the source of the write request. For example, in a Windows environment, filter driver 160 could call IoGetRequestorProcessId to obtain the process id of game installer 130 and then use the process id to obtain the name of game installer 130, which in this example is assumed to be Steam. Then, in step 2*b*, filter driver 160 can employ the identity of the source of the write request to determine if the cached selective compression configuration includes any applicable entries. For example, filter driver 160 could determine that the selective compression configuration includes an entry for Steam and that the entry specifies that compression/decompression of this type of file should be offloaded to compression engine 212. Additionally, filter driver 160 can determine which compression technique should be used. In this example, it is assumed that the file is an audio file and that the selective compression configuration specifies that Steam's audio files should be compressed using FLAC. Filter driver 160 may also confirm that the specified compression technique is included in the available compression techniques retrieved form compression engine 212, or if not, select from among the available compression techniques. In some embodiments, the selective compression configuration could specify more than one compression technique that could be used for a particular type of file, and filter driver 160 may select one of the compression techniques based on the available compression techniques.

In step 2*c*, as opposed to allowing the write request to be passed further down the I/O pathway in a normal fashion (which may result in the CPU/GPU performing the compression or may result in the file being stored in flash memory 220 without compression), filter driver 160 can send a write compress request to compression engine 212. In some embodiments, this write compress request can identify the file to be written (e.g., a Starting_Offset value), a buffer in which the data is currently stored (e.g., a Data_Write_Buffer value) and the compression technique to use (e.g., FLAC), among possibly other information.

Figure 6C:
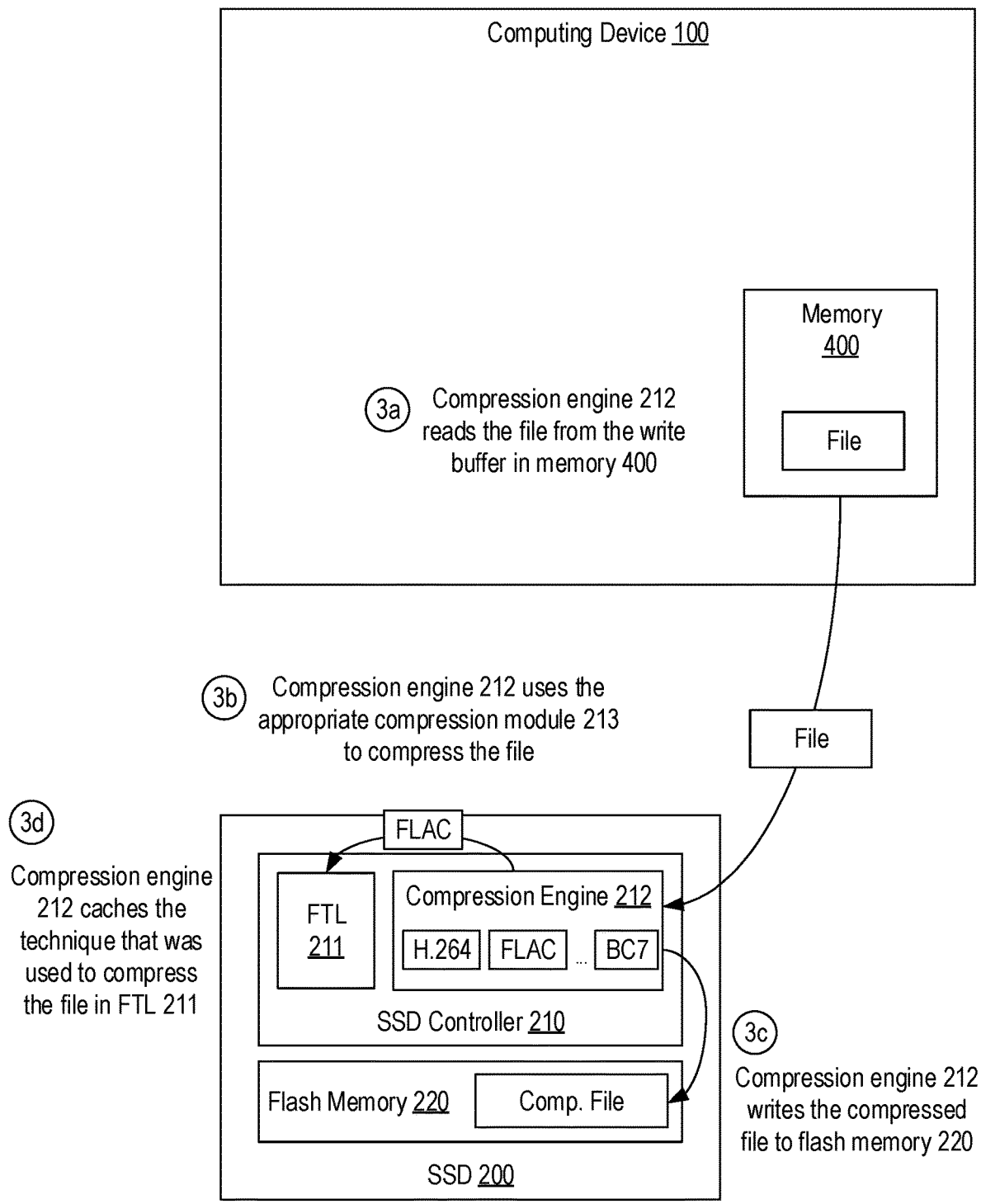

Turning to FIG. 6C, in response to receiving the write compress request from filter driver 160, in step 3*a*, compression engine 212 can read the file from the write buffer in memory 400 (e.g., using DMA). In step 3*b*, compression engine 212 can use the appropriate compression module 213 to perform the compression on SSD 200. For example, compression engine 212 can use the compression technique specified in the write compress request to select FLAC module 213 to perform the compression. In step 3*c*, once the file is compressed, compression engine 212 can write the compressed file to flash memory 220 via FTL 211. In step 3*d*, compression engine 212 can also store the compression technique in FTL 211. For example, compression engine 212 can store an indication that FLAC was used in the metadata associated with the logical block addresses in which the compressed file is stored.

Figure 6D:
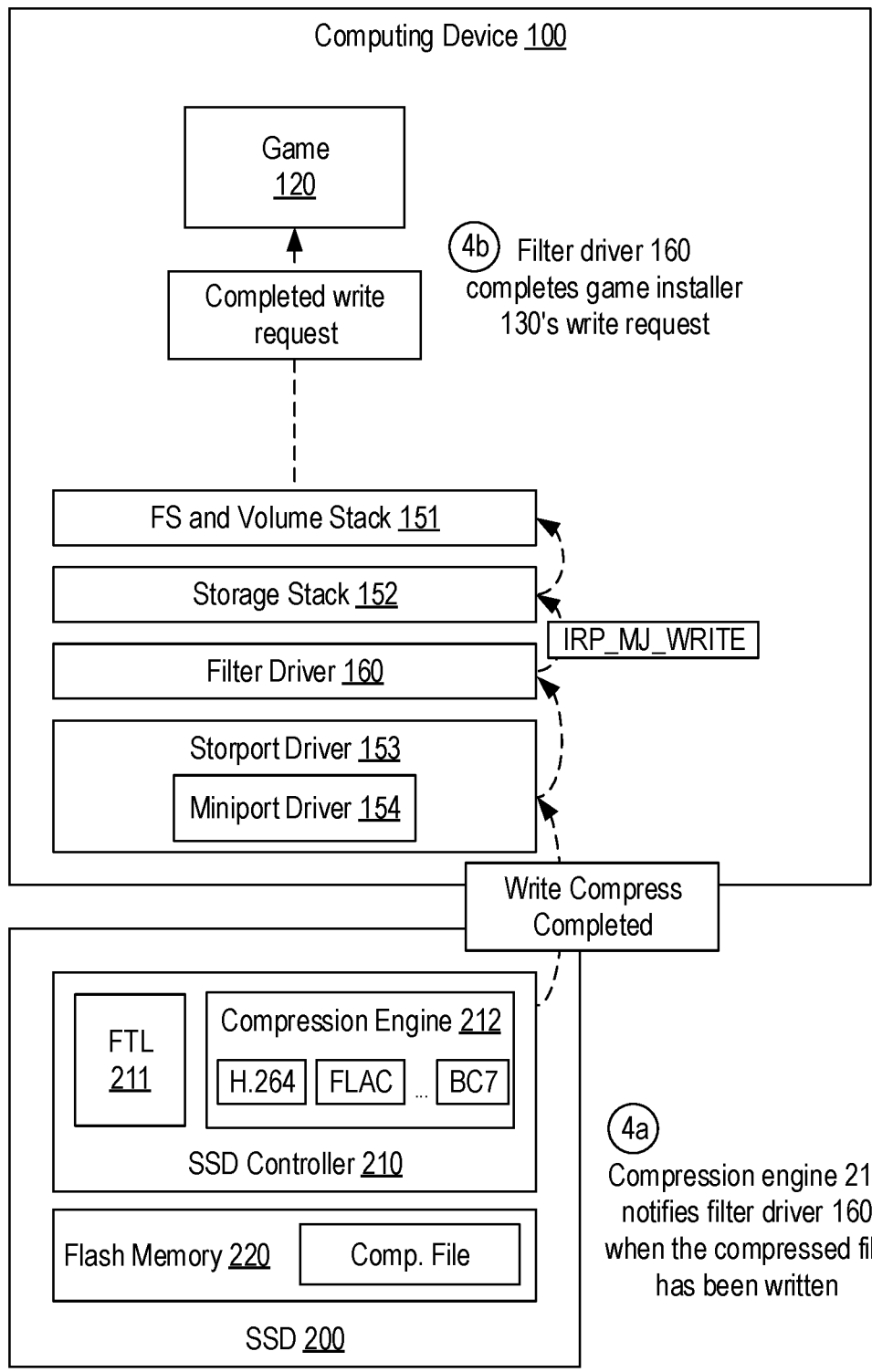

Turning to FIG. 6D, after compression engine 212 has compressed and written the file to flash memory 220, in step 4*a*, compression engine 212 can notify filter driver 160 accordingly. Then, in step 4*b*, filter driver 160 can cause game installer 130's write request to be completed. For example, filter driver 160 can cause the I/O request to be completed successfully. As a result of this process, the file that game installer 130 attempted to write will be stored in flash memory 220, but will be compressed in accordance with the selective compression configuration. Notably, because the compression is performed on SSD 200 rather than by the CPU or GPU of computing device 100, computing device 100's performance, and therefore game installer 130's performance, may be enhanced. Furthermore, in embodiments where the file would not otherwise be compressed, the selective compression of the file minimizes the amount of data that is written to flash memory 220 which may reduce the likelihood that computing device 100 will run out of storage and may prolong the life of SSD 200.

Given that the file is compressed in flash memory 220, when any application, such as NBA 2K21, attempts to read the file, the steps in FIGS. 5A-5D can be performed to decompress the file on SSD 200 thereby enhancing the performance of the application, and the performance of computing device 100 in general, during the read.

In some embodiments, filter driver 160 may be configured to selectively offload compression and decompression based on the file type in the addition to the source of the request. For example, in the case of a write request, filter driver 160 may determine if the type of the file to be written is a file type that should be compressed (e.g., using the selective compression configuration). If so, filter driver 160 can also determine if the selective compression configuration indicates that compression should be offloaded for files that the source of the request attempts to write. If so, the compression can be performed as described above. In contrast, if the application attempting to write the file is not identified as an application for which compression should be offloaded but for which compression should still be performed, filter driver 160 can cause the file to be compressed by the CPU/GPU on computing device 100 as opposed to being offloaded to compression engine 212. As a particular example of such embodiments, filter driver 160 could cause an audio file being written by game installer 130 to be compressed by compression engine 212 while causing an audio file being written by an antivirus application to be compressed by the CPU/GPU of computing device 100. This type of selective offloading can also be performed when decompressing a file that is being read.

In some embodiments, filter driver 160 may be configured to select a particular compression technique based on hints it may receive about the file to be compressed. For example, a file system filter driver may be used to obtain the file name, path, extension, etc. of the file to be written and may pass such hints to filter driver 160. In such cases, the selective compression configuration may define criteria for selecting a particular compression technique based on such hints. As one example only, this may enable filter driver 160 to employ one compression technique for a first audio file extension and another compression technique for a second audio file extension.

In some embodiments, filter driver 160 may be configured to selectively offload the compression or decompression of a file to compression engine 212 based on performance of computing device 100 and/or performance of SSD 200. For example, service 110 (and/or another component such as a machine learning agent) may be configured to monitor the performance of computing device 100 (e.g., the CPU's load, memory consumption, etc.) and performance of SSD 200 (e.g., its write amplification, endurance, compression ratio, etc., and may notify filter driver 160 of such performance. In such cases, filter driver 160 can determine whether to offload the compression or decompression of a file to compression engine 212 based on the performance reported by service 110. For example, if it is determined that the write amplification is poor when offloading the compression of large files to compression engine 212, filter driver 160 may stop offloading the compression of large files. Other contexts could be employed with this type of performance-based selective offloading including the application that is the source of the request, the file type, the file size, the battery charge, the speed of SSD controller 210, etc.

Although the preceding examples described embodiments where compression engine 212 is implemented as part of the hardware controller of an SSD, compression engine 212 could similarly be implemented as part of the hardware controller on other types of drives. Also, although the preceding examples focus on how embodiments of the present invention may be implemented in the context of games, embodiments may equally be implemented in the context of any other application.

In summary, embodiments of the present invention enable the compression or decompression of a file to be selectively offloaded to a hardware controller based on a variety of criteria. By selectively offloading compression and decompression, the performance of a computing device may be improved, particularly when running games, and the life of a drive may be prolonged.

Embodiments of the present invention may comprise or utilize special purpose or general-purpose computers including computer hardware, such as, for example, one or more processors and system memory. Embodiments within the scope of the present invention also include physical and other computer-readable media for carrying or storing computer-executable instructions and/or data structures. Such computer-readable media can be any available media that can be accessed by a general purpose or special purpose computer system.

Computer-readable media are categorized into two disjoint categories: computer storage media and transmission media. Computer storage media (devices) include RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other similar storage medium which can be used to store desired program code means in the form of computer-executable instructions or data structures and which can be accessed by a general purpose or special purpose computer. Transmission media include signals and carrier waves. Because computer storage media and transmission media are disjoint categories, computer storage media does not include signals or carrier waves.

Computer-executable instructions comprise, for example, instructions and data which, when executed by a processor, cause a general-purpose computer, special purpose computer, or special purpose processing device to perform a certain function or group of functions. The computer executable instructions may be, for example, binaries, intermediate format instructions such as assembly language or P-Code, or even source code.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, smart watches, pagers, routers, switches, and the like.

The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices. An example of a distributed system environment is a cloud of networked servers or server resources. Accordingly, the present invention can be hosted in a cloud environment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description.

What is claimed:

1. A method for selectively offloading compression or decompression of a file to a hardware controller, the method comprising:

causing a service to be executed on the computing device, the service maintaining a lookup table that defines a plurality of selective compression configurations, each selective compression configuration defining: (1) a particular application to which the selective compression configuration pertains, (2) one or more file types, (3) whether compression of files having one of the one or more file types should be offloaded to a compression engine on a drive of the computing device when the particular application attempts to write such files to the drive, and (4) one or more compression techniques that should be used when compression of such files is offloaded to the compression engine on the drive;

causing a filter driver to be loaded above a storage port driver and below a storage stack in an I/O pathway on a computing device, the storage port driver pertaining to the drive of the computing device;

after the filter driver is loaded, sending, by the service, the lookup table to the filter driver;

receiving, by the filter driver, a first write request that is being passed down the I/O pathway, the first write request attempting to write a first file to the drive;

in response to receiving the first write request, interfacing, by the filter driver, with an operating system of the computing device to identify a first application as a source of the first write request;

determining, by the filter driver, that the first file has a first file type;

querying, by the filter driver, the lookup table received from the service to identify a first selective compression configuration of the plurality of selective compression configurations that pertains to the first application and to determine, from the first selective compression configuration and based on the first file having the first file type, that compression of the first file should be offloaded to the compression engine on the drive rather than allowing the first write request to be passed further down the I/O pathway to thereby cause the first file to be compressed by a CPU or GPU of the computing device;

in response to determining, from the first selective compression configuration and based on the first file having the first file type, that compression of the first file should be offloaded to the compression engine on the drive, preventing the first write request from being sent further down the I/O pathway;

also in response to determining, from the first selective compression configuration and based on the first file having the first file type, that compression of the first file should be offloaded to the compression engine on the drive, identifying a first compression technique that is specified in the first selective compression configuration;

further in response to determining, from the first selective compression configuration and based on the first file having the first file type, that compression of the first file should be offloaded to the compression engine on the drive, sending, by the filter driver and to the compression engine, a write compress request that identifies the first file and the first selective compression configuration to thereby cause the compression engine to compress the first file using the first compression technique and then store the compressed first file on the drive;

receiving, by the filter driver, a notification from the compression engine, the notification confirming that the first file has been compressed using the first compression technique and the compressed first file has been stored on the drive; and in response to receiving the notification from the compression engine, completing, by the filter driver, the first write request to thereby prevent the first write request from being passed further down the I/O pathway.

2. The method of claim 1, wherein the drive is a solid-state drive.

3. The method of claim 2, wherein the compression engine is part of a controller of the solid-state drive.

4. The method of claim 1, wherein the service configures the first selective compression configuration to define whether compression of files having one of the one or more file types should be offloaded to the compression engine on the drive of the computing device when the first application attempts to write such files to the drive based on one or both of:
evaluating performance of the drive; or
evaluating performance of the computing device.

5. The method of claim 1, further comprising:
intercepting, by the filter driver, a read request that is attempting to read the first file;
in response to intercepting the read request, interfacing with the operating system to identify the first application as a source of the read request;
accessing the first selective compression configuration to determine whether decompression of files read by the first application should be offloaded to the compression engine; and
in response to determining that the decompression of files read by the first application should be offloaded to the compression engine, handling the read request by sending a decompress request to the compression engine to decompress the first file and then store the decompressed first file in memory on the computing device.

6. The method of claim 5, further comprising:
decompressing, by the compression engine, the first file.

7. The method of claim 1, further comprising:

intercepting, at the filter driver, a second write request that is attempting to write a second file to the drive;
in response to intercepting the second write request, interfacing with the operating system to identify a second application as a source of the second write request;
accessing a second selective compression configuration of the plurality of selective compression configurations to determine whether compression of files written by the second application should be offloaded to the compression engine on the drive; and
in response to determining that the compression of files written by the second application should not be offloaded to the compression engine on the drive, passing the second write request down the I/O pathway to thereby allow the second file to be compressed by a CPU or GPU of the computing device and then written to the drive.

8. One or more computer storage media storing computer executable instructions which when executed implement a method for selectively offloading compression or decompression of a file to a hardware controller, the method comprising:
causing a service to be executed on the computing device, the service maintaining a lookup table that defines a plurality of selective compression configurations, each selective compression configuration defining: (1) a particular application to which the selective compression configuration pertains, (2) one or more file types, (3) whether compression of files having one of the one or more file types should be offloaded to a compression engine on a drive of the computing device when the particular application attempts to write such files to the drive, and (4) one or more compression techniques that should be used when compression of such files is offloaded to the compression engine on the drive;
causing a filter driver to be loaded above a storage port driver and below a storage stack in an I/O pathway on a computing device, the storage port driver pertaining to the drive of the computing device;
after the filter driver is loaded, sending, by the service, the lookup table to the filter driver;
receiving, by the filter driver, a first write request that is being passed down the I/O pathway, the first write request attempting to write a first file to the drive;
in response to receiving the first write request, interfacing, by the filter driver, with an operating system of the computing device to identify a first application as a source of the first write request;
determining, by the filter driver, that the first file has a first file type;
querying, by the filter driver, the lookup table received from the service to identify a first selective compression configuration of the plurality of selective compression configurations that pertains to the first application and to determine, from the first selective compression configuration and based on the first file having the first file type, that compression of the first file should be offloaded to the compression engine on the drive rather than allowing the first write request to be passed further down the I/O pathway to thereby cause the first file to be compressed by a CPU or GPU of the computing device;
in response to determining, from the first selective compression configuration and based on the first file having the first file type, that compression of the first file should be offloaded to the compression engine on the drive, preventing the first write request from being sent further down the I/O pathway;

also in response to determining, from the first selective compression configuration and based on the first file having the first file type, that compression of the first file should be offloaded to the compression engine on the drive, identifying a first compression technique that is specified in the first selective compression configuration;

further in response to determining, from the first selective compression configuration and based on the first file having the first file type, that compression of the first file should be offloaded to the compression engine on the drive, sending, by the filter driver and to the compression engine, a write compress request that identifies the first file and the first selective compression configuration to thereby cause the compression engine to compress the first file using the first compression technique and then store the compressed first file on the drive;

receiving, by the filter driver, a notification from the compression engine, the notification confirming that the first file has been compressed using the first compression technique and the compressed first file has been stored on the drive; and in response to receiving the notification from the compression engine, completing, by the filter driver, the first write request to thereby prevent the first write request from being passed further down the I/O pathway.

9. The computer storage media of claim 8, wherein the drive is a solid-state drive.

10. The computer storage media of claim 9, wherein the compression engine is part of a controller of the solid-state drive.

11. The computer storage media of claim 8, wherein the service configures the first selective compression configuration to define whether compression of files having one of the one or more file types should be offloaded to the compression engine on the drive of the computing device when the first application attempts to write such files to the drive based on one or both of:
    evaluating performance of the drive; or
    evaluating performance of the computing device.

12. The computer storage media of claim 8, wherein the method further comprises:
    intercepting, by the filter driver, a read request that is attempting to read the first file;
    in response to intercepting the read request, interfacing with the operating system to identify the first application as a source of the read request;
    accessing the first selective compression configuration to determine whether decompression of files read by the first application should be offloaded to the compression engine; and
    in response to determining that the decompression of files read by the first application should be offloaded to the compression engine, handling the read request by sending a decompress request to the compression engine to decompress the first file and then store the decompressed first file in memory on the computing device.

13. The computer storage media of claim 12, wherein the method further comprises:
    decompressing, by the compression engine, the first file.

14. The computer storage media of claim 8, wherein the method further comprises:
    intercepting, at the filter driver, a second write request that is attempting to write a second file to the drive;
    in response to intercepting the second write request, interfacing with the operating system to identify a second application as a source of the second write request;
    accessing a second selective compression configuration of the plurality of selective compression configurations to determine whether compression of files written by the second application should be offloaded to the compression engine on the drive; and
    in response to determining that the compression of files written by the second application should not be offloaded to the compression engine on the drive, passing the second write request down the I/O pathway to thereby allow the second file to be compressed by a CPU or GPU of the computing device and then written to the drive.

15. A computing device comprising:
one or more processors; and
one or more computer storage media storing computer executable instructions which when executed by the one or more processors implement a method for selectively offloading compression or decompression of a file to a hardware controller, the method comprising:
    causing a service to be executed on the computing device, the service maintaining a lookup table that defines a plurality of selective compression configurations, each selective compression configuration defining: (1) a particular application to which the selective compression configuration pertains, (2) one or more file types, (3) whether compression of files having one of the one or more file types should be offloaded to a compression engine on a drive of the computing device when the particular application attempts to write such files to the drive, and (4) one or more compression techniques that should be used when compression of such files is offloaded to the compression engine on the drive;
    causing a filter driver to be loaded above a storage port driver and below a storage stack in an I/O pathway on a computing device, the storage port driver pertaining to the drive of the computing device;
    after the filter driver is loaded, sending, by the service, the lookup table to the filter driver;
    receiving, by the filter driver, a first write request that is being passed down the I/O pathway, the first write request attempting to write a first file to the drive;
    in response to receiving the first write request, interfacing, by the filter driver, with an operating system of the computing device to identify a first application as a source of the first write request;
    determining, by the filter driver, that the first file has a first file type;
    querying, by the filter driver, the lookup table received from the service to identify a first selective compression configuration of the plurality of selective compression configurations that pertains to the first application and to determine, from the first selective compression configuration and based on the first file having the first file type, that compression of the first file should be offloaded to the compression engine on the drive rather than allowing the first write request to be passed further down the I/O pathway to thereby cause the first file to be compressed by a CPU or GPU of the computing device;

in response to determining, from the first selective compression configuration and based on the first file having the first file type, that compression of the first file should be offloaded to the compression engine on the drive, preventing the first write request from being sent further down the I/O pathway;

also in response to determining, from the first selective compression configuration and based on the first file having the first file type, that compression of the first file should be offloaded to the compression engine on the drive, identifying a first compression technique that is specified in the first selective compression configuration;

further in response to determining, from the first selective compression configuration and based on the first file having the first file type, that compression of the first file should be offloaded to the compression engine on the drive, sending, by the filter driver and to the compression engine, a write compress request that identifies the first file and the first selective compression configuration to thereby cause the compression engine to compress the first file using the first compression technique and then store the compressed first file on the drive;

receiving, by the filter driver, a notification from the compression engine, the notification confirming that the first file has been compressed using the first compression technique and the compressed first file has been stored on the drive; and in response to receiving the notification from the compression engine, completing, by the filter driver, the first write request to thereby prevent the first write request from being passed further down the I/O pathway.

16. The computing device of claim 15, wherein the drive is a solid-state drive.

17. The computing device of claim 16, wherein the compression engine is part of a controller of the solid-state drive.

18. The computing device of claim 15, wherein the service configures the first selective compression configuration to define whether compression of files having one of the one or more file types should be offloaded to the compression engine on the drive of the computing device when the first application attempts to write such files to the drive based on one or both of:

evaluating performance of the drive; or evaluating performance of the computing device.

19. The computing device of claim 15, wherein the method further comprises:

intercepting, by the filter driver, a read request that is attempting to read the first file;

in response to intercepting the read request, interfacing with the operating system to identify the first application as a source of the read request;

accessing the first selective compression configuration to determine whether decompression of files read by the first application should be offloaded to the compression engine; and in response to determining that the decompression of files read by the first application should be offloaded to the compression engine, handling the read request by sending a decompress request to the compression engine to decompress the first file and then store the decompressed first file in memory on the computing device.

20. The computing device of claim 15, wherein the method further comprises:

intercepting, at the filter driver, a second write request that is attempting to write a second file to the drive;

in response to intercepting the second write request, interfacing with the operating system to identify a second application as a source of the second write request;

accessing a second selective compression configuration of the plurality of selective compression configurations to determine whether compression of files written by the second application should be offloaded to the compression engine on the drive; and in response to determining that the compression of files written by the second application should not be offloaded to the compression engine on the drive, passing the second write request down the I/O pathway to thereby allow the second file to be compressed by a CPU or GPU of the computing device and then written to the drive.

* * * * *